US010182497B1

(12) United States Patent
Wang

(10) Patent No.: US 10,182,497 B1
(45) Date of Patent: Jan. 15, 2019

(54) TRANSPARENT AND ANTISTATIC CONFORMAL COATING FOR INTERNAL ESD MITIGATION IN SPACE ENVIRONMENT

(71) Applicant: NORTHROP GRUMMAN SYSTEMS CORPORATION, Falls Church, VA (US)

(72) Inventor: Ge Wang, Los Alamitos, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 289 days.

(21) Appl. No.: 15/176,978

(22) Filed: Jun. 8, 2016

(51) Int. Cl.
*H01B 1/24* (2006.01)
*H05K 1/02* (2006.01)
*H05F 1/02* (2006.01)
*C09D 5/24* (2006.01)
*C09D 165/00* (2006.01)
*B64G 1/54* (2006.01)

(52) U.S. Cl.
CPC ........... *H05K 1/0259* (2013.01); *B64G 1/546* (2013.01); *C09D 5/24* (2013.01); *C09D 165/00* (2013.01); *H05F 1/02* (2013.01); *H05K 2201/0329* (2013.01)

(58) Field of Classification Search
USPC ........................................ 361/212, 218, 220
See application file for complete search history.

(56) References Cited

U.S. PATENT DOCUMENTS

| 5,160,374 A | 11/1992 | Frederickson et al. |
| 5,166,864 A | 11/1992 | Chitwood et al. |
| 5,773,150 A | 6/1998 | Tong et al. |
| 6,261,680 B1 * | 7/2001 | Denman .................. H01B 1/20 257/E23.121 |
| 6,482,521 B1 | 11/2002 | Lee et al. |
| 6,600,101 B2 | 7/2003 | Mazurkiewicz |
| 6,663,956 B2 | 12/2003 | Heberger et al. |
| 6,849,800 B2 | 2/2005 | Mazurkiewicz |
| 7,118,693 B2 | 10/2006 | Glatkowski et al. |
| 7,125,479 B2 | 10/2006 | Sotzing |
| 7,214,889 B2 | 5/2007 | Mazurkiewicz |
| 7,749,603 B2 | 7/2010 | Graham et al. |
| 8,044,150 B2 | 10/2011 | Ibar |
| 8,080,177 B2 * | 12/2011 | Long .......................... C09J 9/02 252/500 |
| 8,414,801 B2 | 4/2013 | Yoshida et al. |
| 8,748,754 B2 | 6/2014 | Kapusta et al. |

(Continued)

FOREIGN PATENT DOCUMENTS

CN 102731971 A 10/2012

OTHER PUBLICATIONS

NASA, "Mitigating In-Space Charging Effects—A Guideline" NASA Technical Handbook, NASA-HDBK-4002A, Mar. 3, 2011, 181 pgs.

*Primary Examiner* — Danny Nguyen

(74) *Attorney, Agent, or Firm* — John A. Miller; Shumaker, Loop & Kendrick, LLP

(57) ABSTRACT

An electronic device on a spacecraft that is enclosed by a conformal coating that is transparent and sufficiently conductive to conduct accumulated charge on the electronic device. The coating includes an intrinsic conducting polymer, such as PEDOT:PSS, dissolved, for example, in an organic solvent, and mixed with a polyurethane, such as Arathane™ 5750 or 5753.

14 Claims, 1 Drawing Sheet

(56) References Cited

U.S. PATENT DOCUMENTS

| | | | |
|---|---|---|---|
| 2002/0113241 A1* | 8/2002 | Kubota | H01L 51/5253 257/79 |
| 2003/0193042 A1 | 10/2003 | Go et al. | |
| 2005/0230560 A1 | 10/2005 | Glatkowski et al. | |
| 2008/0248311 A1 | 10/2008 | Suh et al. | |
| 2009/0074973 A1* | 3/2009 | Graham | H05K 9/0067 427/331 |
| 2009/0078459 A1 | 3/2009 | Nishizakura | |
| 2011/0248223 A1 | 10/2011 | Zheng | |
| 2012/0015179 A1 | 1/2012 | Zheng | |
| 2012/0211739 A1* | 8/2012 | Koyama | H01B 1/122 257/40 |
| 2012/0313050 A1 | 12/2012 | Ibar | |
| 2013/0220514 A1* | 8/2013 | Jagannathan | B05D 3/12 156/67 |

* cited by examiner

TRANSPARENT AND ANTISTATIC CONFORMAL COATING FOR INTERNAL ESD MITIGATION IN SPACE ENVIRONMENT

BACKGROUND

Field

This invention relates generally to providing a transparent and antistatic conformal coating on a circuit board or other electronic device for electrostatic discharge (ESD) mitigation purposes and, more particularly, to providing a transparent and antistatic conformal coating on a circuit board or other electronic device provided on a spacecraft for ESD mitigation purposes, where the coating includes a mixture of a transparent intrinsic conducting polymer (ICP), such as poly (3, 4-ethylenedioxythiophere)-polystyrenesulfonate (PEDOT:PSS), and a polyurethane.

Discussion

Various electronics on a spacecraft are susceptible to charged particles emitted from the space environment that penetrate the spacecraft and are deposited on conductive surfaces or other objects that are not grounded, referred to herein as floating metals. These floating metals include various conductive metals, such as unused wires, metallic radiation shields, fasteners installed on insulated housings, connector back shells, etc. When the charged particles impinge a conductive element that is not grounded, the charge on the element begins to accumulate. The charged particles can charge the floating metals to thousands of volts in the space environment and are able to discharge when the breakdown voltage of the surrounding insulation is reached, referred to herein as internal electrostatic discharge (IESD). Such a discharge event can be a noise source that interferes with the operation of the electronics or can even cause destruction of the circuits in certain instances. Consequently, all floating metals must be grounded either through the proper selection of materials, physical wiring or bonding with a conductive adhesive to ground. Such design solutions have been effective, but identifying all of the floating metals on the spacecraft can be tedious and the assembly process of grounding these parts is laborious. Thus, some floating metals are often times over looked during the design process, and must be grounded after the hardware has been assembled.

It is known in the art to provide a protective coating on the various circuit boards and electronics on a spacecraft in order to protect the electronics from moisture and other environmental contaminants, where the coating may also be used to protect the circuit from internal electrostatic discharge. Known protective coatings for this purpose are often times polyurethane coatings that typically are not conductive enough to allow charge to dissipate to meet the necessary requirements. For example, it is known in the art to coat an electronic component or circuit board with a "leaky" conformal coating having a volume resistivity of $10^{10}$ ohm-cm or less. The most widely used conformal coating for space flight electronics is Arathane™ 5750, which has low vacuum out gassing. However, this coating has a very high volume resistivity of $9.3 \times 10^{15}$ ohm-cm at room temperature and cannot be regarded as antistatic or dissipative. Further, the volume resistivity of these coatings are often times temperature dependent, where the coating may barely meet the dissipative resistance requirement when it is heated, but may not when it is in cold space. In other words, when the circuit board is in a cooler environment, such as being directed away from the sun, the resistance of the coating may increase, which may not allow it to dissipate charge to the desired requirements. It is also usually necessary that a circuit board or electronic device on a spacecraft be inspectable for various reasons, including identifying markings and indicia on the circuit board to make sure that the electric circuit is properly connected. For example, inspection of the circuit board may require that the polarity of the electric component be properly identified. Further, markings on the particular circuit board may be important, such as identification of the manufacturer, manufacturing date, etc.

It has been suggested in the art to mix a polyurethane conformal coating with a conductive metal oxide to make a circuit board coating antistatic, where the oxide to conformal coating mixture ratio is 1:1 to 5:1. In order to make the coating transparent, the reflective index of the metal oxide needs to match that of the conformal coating. As such, a complex metal oxide such as $(Al, Mg, Zn)_3O_4$ must be used. The availability of specialty tri-metallic oxides and the large volume fraction of the oxide in the conformal coating makes such a mixture less commercially viable.

It is also been proposed in the art to employ an intrinsic conducting polymer (ICP) as a coating for spacecraft electronics, such as polyaniline doped with dodecylbenzene sulfonic acid (PANI:DBSA). Only a small fraction, such as 0.5-4 weight %, of the ICP is required to make the conformal coating antistatic. However, the resulting conformal coating is not sufficiently transparent to allow inspection of the coated electronic components. In fact, when the ICP content is between 0.5-1 weight %, the cured conformal coating is translucent, and becomes opaque when the ICP content exceeds 1 weight %. Thus, this solution is typically not practical because the coating becomes non-transparent or translucent. Further, by adding more of the conductive polymer to the mixture, the mechanical properties of the coating is reduced, which reduces the mechanical integrity of the circuit board.

DETAILED DESCRIPTION OF THE EMBODIMENTS

The following discussion of the embodiments of the invention directed to providing a transparent and conductive polymer coating on a circuit board for ESD mitigation purposes is merely exemplary in nature, and is in no way intended to limit the invention or its applications or uses. For example, the discussion herein refers to coating circuit boards and other electronics on a spacecraft. However, as will be appreciated by those skilled in the art, the conformal coating may have application for circuit boards other than those on spacecraft.

Figure 1:
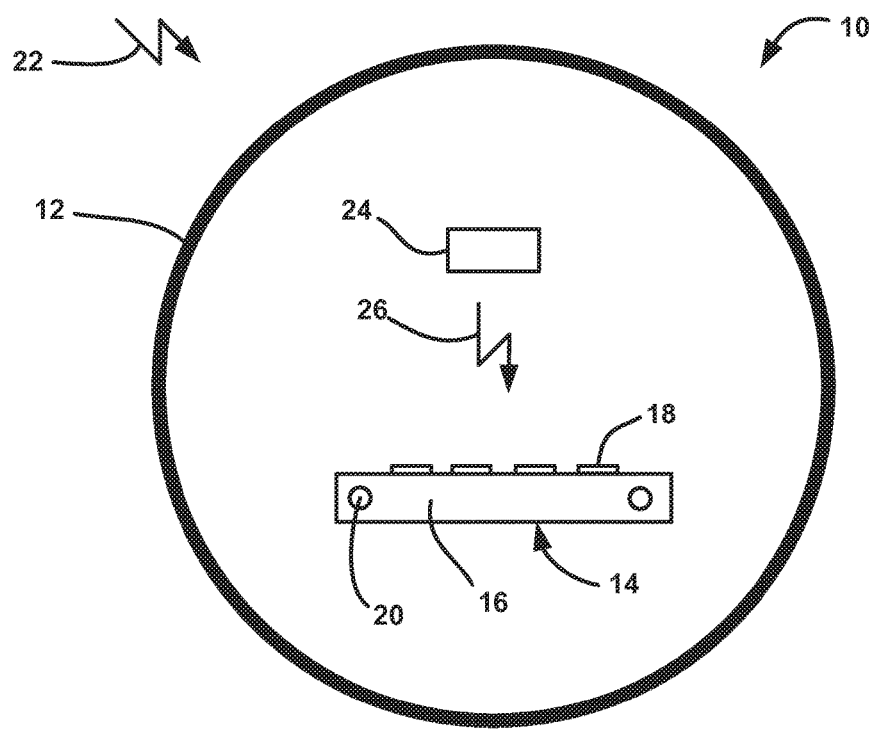
FIG. 1 is an illustration of a spacecraft including a circuit board.

FIG. 1 is a simple illustration of a spacecraft 10 including an outer spacecraft housing or shell 12, which may be an aluminum shell and having a certain thickness, such as 50-100 mils, that is suitable for a particular space mission. The spacecraft 10 includes a general depiction of a circuit board 14 that is intended to represent any circuit or electronic device on the spacecraft 10 being used for any purpose, such as communications, sensors, controls, etc. The circuit board 14 includes a base substrate 16 and a number of electronic components 18 mounted to the substrate 16 that may be any electrical device, such as transistors, signal traces, diodes, etc. The circuit board 14 also includes various other conductive elements or devices 20, which may be fasteners, connectors, etc., that may be ungrounded, and may be susceptible to energetic electrons or other charged particles 22 that may penetrate the shell 12 and collect on the circuit board 14. Further, the spacecraft 10 may include a number of ungrounded floating metal components, represented generally by box 24, that can include any conductive element on the spacecraft 10, such as structural components, connectors, etc., and that may also collect charge from the energetic electrons 22, and since it is ungrounded, may discharge to the circuit board 14 represented by charge line 26, which could cause undesirable noise in the circuit components 18, or have a damaging effect.

As will be discussed in detail below, the present invention proposes providing a conformal coating completely enclosing the circuit board 14 that is both transparent and conductive enough to dissipate charge that may accumulate on the circuit board 14 for both hot and cold environments. As discussed above, conformal coatings are known in the art for protecting electronic components on a spacecraft. The present invention proposes making such conformal coatings suitably conductive to allow dissipation of the charge, but still be transparent, where the conductive requirements are provided by certain directives, such as NASA-HDBK-4002.

Figure 2:
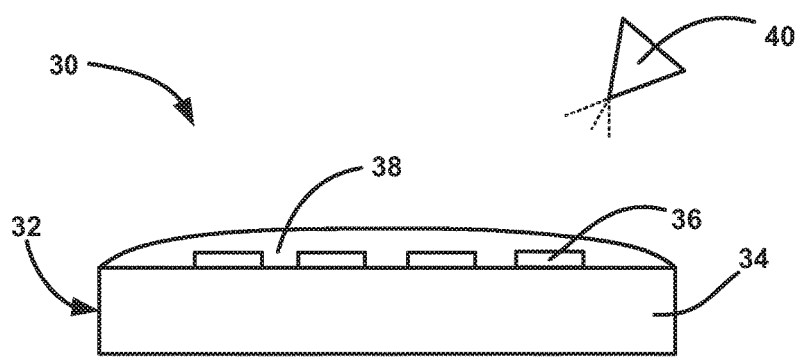
FIG. 2 is a profile view of a circuit board including a transparent and antistatic conformal coating.

FIG. 2 is an illustration 30 showing a circuit board 32 similar to the circuit board 14, and including a substrate 34 on which is mounted a number of electronic components 36. The circuit board 32 also includes a conformal coating 38 of the type being discussed herein that is intended to completely enclose the circuit board 32 to a desired thickness to provide the necessary protective features, but also be conductive enough to dissipate electrostatic charge that may accumulate thereon from, for example, the charged particles 22, and also be transparent. In one embodiment, the conformal coating 38 is a mixture of an ICP and polyurethane in a ratio so that it is suitably conductive and transparent as discussed. The coating 38 can be applied to the circuit board 32 in any suitable manner, such as by spraying through a spray source 40, or by being brushed on.

In one embodiment, the conformal coating 38 is a mixture of 1.5-2.5% PEDOT:PSS dissolved in Tuluene, which is an organic solvent, and is commercially available from Heraeus as Clevios™ HTL Solar 3, i.e., poly(3,4-ethylenedioxythiophene)-complex, and a polyurethane, such as Arathane™ 5750 available from Huntsman Advanced Materials, which is a low-out gassing polyurethane. In one specific example, the coating 38 is 20 parts by weight of Clevious™ HTL Solar 3 mixed with 100 parts by weight of Part B of Arathane™ 5750 to provide a modified Part B, and 18 parts by weight of Part A of Arathane™ 5750 mixed with 120 parts by weight of the modified Part B. Other polyurethane conformal coating systems, such as Solithane™ 113, which is also a low-out gassing polyurethane, also can be employed instead of Arathane™ 5750.

In another embodiment that provides a lower volume resistivity, the coating 38 is 40 parts by weight of Clevios™ HTL Solar 3 mixed with 100 parts by weight of Part B of Arathane™ 5753 to provide a modified Part B, and 20 parts by weight of Part A of Arathane™ 5753 mixed with 140 parts by weight of the modified Part B.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. An electronic device on a spacecraft, said device being enclosed with a single outer layer conformal coating that is transparent and sufficiently conductive to conduct accumulated charge on the electronic device, said coating including an intrinsic conducting polymer mixed with a polyurethane.

2. The electronic device according to claim 1 wherein the intrinsic conducting polymer is (PEDOT:PSS poly (3, 4-ethylenedioxythiophere)-polystyrenesulfonate).

3. The electronic device according to claim 2 wherein the PEDOT:PSS is dissolved in an organic solvent as a mixture.

4. The electronic device according to claim 3 where the ratio of PEDOT:PSS in the organic solvent is 1.5-2.5%.

5. The electronic device according to claim 3 wherein the organic solvent is Tuluene.

6. The electronic device according to claim 5 wherein the coating is 20 parts by weight of the mixture mixed with the polyurethane.

7. The electronic device according to claim 5 wherein the coating is 40 parts by weight of the mixture mixed with the polyurethane.

8. The electronic device according to claim 1 wherein the conformal coating is a sprayed on coating.

9. An electronic device on a spacecraft, said electronic device being enclosed with a single layer conformal coating that is transparent and sufficiently conductive to conduct accumulated charge on the electronic device, said coating including a mixture of PEDOT:PSS dissolved in an organic solvent and a polyurethane.

10. The electronic device according to claim 9 where the ratio of PEDOT:PSS in the organic solvent is 1.5-2.5%.

11. The electronic device according to claim 9 wherein the organic solvent is Tuluene.

12. The electronic device according to claim 11 wherein the coating is 20 parts by weight of the mixture mixed with 100 parts by weight of the polyurethane.

13. The electronic device according to claim 11 wherein the coating is 40 parts by weight of the mixture mixed with 100 parts by weight of the polyurethane.

14. The electronic device according to claim 9 wherein the conformal coating is a sprayed on coating.

* * * * *